United States Patent [19]

Miller

[11] 4,286,215
[45] Aug. 25, 1981

[54] METHOD AND APPARATUS FOR THE CONTACTLESS MONITORING CARRIER LIFETIME IN SEMICONDUCTOR MATERIALS

[75] Inventor: Gabriel L. Miller, Westfield, N.J.

[73] Assignee: Bell Telephone Laboratories, Incorporated, Murray Hill, N.J.

[21] Appl. No.: 40,394

[22] Filed: May 18, 1979

[51] Int. Cl.³ .............................................. G01R 31/26
[52] U.S. Cl. .......................... 324/158 R; 324/158 D
[58] Field of Search ............ 324/158 R, 158 D, 57 Q; 331/66

[56] References Cited

U.S. PATENT DOCUMENTS

| | | |
|---|---|---|
| 3,234,461 | 2/1966 | Trent et al. ...................... 324/158 D |
| 3,737,803 | 6/1973 | Kojima et al. ......................... 331/66 |
| 4,000,458 | 12/1976 | Miller et al. |

OTHER PUBLICATIONS

Robinson, F. N. H.; "Nuclear Resonance..."; J. of Sci. Instruments, vol. 36, Dec. 1959, pp. 481-487.
"Measurement of Silicon Parameters"; Electronic Design; Nov. 25, 1959, p. 167.
Weingarten et al.; "Radio-Frequency Carrier..."; J. of the Electrochemical Soc., vol. 108, No. 2, Feb. 1961, pp. 167-171.

*Primary Examiner*—Ernest F. Karlsen
*Attorney, Agent, or Firm*—Peter V. D. Wilde

[57] ABSTRACT

The lifetime of minority carriers in semiconductor materials is measured by a noncontacting steady-state method adapted for monitoring of the condition of wafers during device manufacture. The method comprises coupling the sample into an LC resonant circuit which is the frequency-determining portion of a marginal-oscillator adapted to maintain either a constant amplitude RF signal, or be driven by a constant current generator, and measuring either the current required to so maintain the signal, or the difference in RF voltage, either of which is related to the sample's conductivity. Illuminating the sample with light of appropriate frequency from an intermittent source modulates the conductivity, and the difference in the steady-state values of conductivity in the illuminated and the dark condition is proportional to the minority carrier lifetime. Exemplary apparatus has a lifetime resolution of about 0.1 μsec, with a measurement time of 0.4 sec, and a sampled area of about 0.3 cm².

9 Claims, 4 Drawing Figures

MEASUREMENT RESULTS
(MICROSECONDS)

METHOD AND APPARATUS FOR THE CONTACTLESS MONITORING CARRIER LIFETIME IN SEMICONDUCTOR MATERIALS

BACKGROUND OF THE INVENTION

1. Field of the Invention

The invention is in the field of electronic solid state device processing, more particularly, measurement of minority carrier lifetime in semiconductor material.

2. Description of the Prior Art

The ability rapidly and accurately to determine various parameters of semiconductor material prior to and during processing is of critical importance in solid state device manufacturing. One of the parameters of interest is the lifetime of minority carriers in a particular sample of material. Determination of this lifetime is important in the classification of semiconductor substrate materials prior to processing, as well as to the monitoring of dopant diffusion, of ion implantation, and of the effects of other manufacturing steps.

A widely used method of semiconductor lifetime measurement is that of photoconductive decay. In this method, one illuminates the sample with optical radiation of frequency equal to or higher than the frequency required to excite electrons from the valence band across the band gap into the conduction band, thereby generating holeelectron pairs in the sample. The presence of these additional carriers results in increased conductivity of the sample. It is this increment of conductivity that is referred to as photoconductivity. After abruptly switching off the light source, the sample's conductivity relaxes back exponentially to its equilibrium value, with a time constant that is equal to the effective carrier lifetime. By measuring, with suitable apparatus, the conductivity of the sample during this relaxation one can thus determine the lifetime. The conductivity can be measured by actually applying contacts to the sample, but it can also be measured in a contactless way. Such contactless photoconductive decay methods are often applied to the determination of lifetime in large semiconductor single crystal ingots, but are generally not applied to small samples such as wafers, since typically their sensitivity is insufficient to yield an acceptable signal-to-noise ratio there.

Existing methods of lifetime determination are generally not well adapted to production line monitoring of semiconductor wafers, where by "wafer" we mean a thin disk, such as is currently generally used in device manufacture. This is particularly evident for methods that require contacting the sample. But even existing contactless methods have drawbacks that make their application for production line monitoring difficult. For instance, methods based on the observation of the relaxation of the conductivity require both light sources and measurement systems whose response is very fast compared to the sample lifetimes. This poses difficult problems for carrier lifetimes of much less than $\sim 1 \mu s$. Measurement techniques are reviewed in, for instance, J. Mort and D. M. A. Tai, Photoconductivity and Related Phenomena, Elsevier, 1976, and G. L. Miller et al., "Non-Destructive Electrical Test Methods for Semiconductor Materials," Proceedings of the Topical Conference on Characterization Techniques for Semiconductor Materials and Devices; Electrochemical Society, Electronics Division, V78-3, pp. 1-17 (1978).

SUMMARY OF THE INVENTION

A noncontacting steady-state technique has been developed for the monitoring of the minority carrier lifetime in semiconductor samples, the technique being especially well adapted to monitoring samples, such as semiconductor wafers, during manufacturing, as well as to measuring the lifetime as a function of position in semiconductor materials. Here we intend the term "monitoring" to include not only actually measuring the lifetime but also determining the fact that the lifetime is either within, or not within, a preselected range of values, such as in a "go, no-go" test. A further special advantage of the method is the possibility of carrying out the measurements through an insulating layer, such as a thin protective oxide layer, since in practice such a configuration is often encountered. Because the technique is a low-frequency, steady-state method, it does not require fast light sources or detection systems, even for short lifetime samples, and, in addition, evaluation of the measurement results is particularly simple since apparatus can be used that provides an outut that is directly proportional to carrier lifetime. This also makes the method suitable for automatic monitoring, and distinguishes the method from other contactless measurement methods that require fast light sources and the extraction of the time constant of an exponential from the measurement results.

In the inventive technique, a suitable light source is turned on and off at a frequency low compared to the reciprocal of the longest lifetime of interest, and the conductivity is measured by contactless means both during the periods of illumination and non-illumination. For instance, if the switching frequency is $\frac{1}{4}$ of the reciprocal of the lifetime, then the conductivity would reach values within 2% of the final asymptotic value, and thus such frequency might in practice be acceptable. It will be readily understood, however, that other switching frequencies may be selected, depending on the constraints of the individual situation. The difference in conductivity can be shown to be proportional to the effective carrier lifetime in the sample at points adjacent to the coupling means. In exemplary apparatus constructed to illustrate this measurement technique phase sensitive detection techniques are used to improve the measurement accuracy. This apparatus exhibited a noise level of approximately 0.1 microseconds, with a measurement time of 0.4 seconds, and sampled an area of approximately 0.3 cm$^2$.

DETAILED DESCRIPTION

Figure 1:
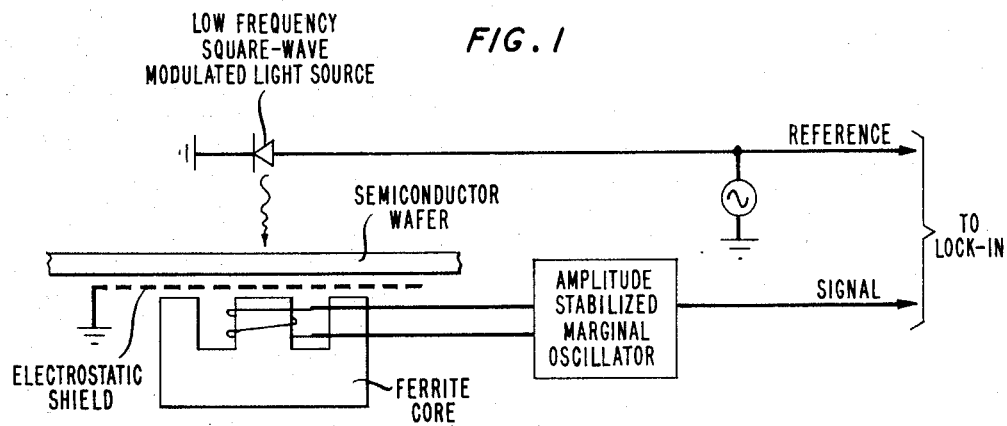
FIG. 1 is a schematic representation of the basic elements of a device for the practice of the claimed method.

The measurement of minority carrier lifetime in semiconductor material is of importance in many facets of solid state device processing. For example, it is often desirable to classify wafers prior to processing to make sure that the material has sufficiently long lifetime. During processing, it may be important to monitor the effects of various fabrication steps on the lifetime. Such steps can involve diffusion, ion implantation, or, for instance, removal of undesirable impurities, such as by gettering. Since such steps often are caused to take place through apertured masking layers, the monitoring of these steps typically is carried out on blank wafers which have been subjected to identical treatment, but it is also possible to monitor the actual production material by comparing these measurement results with results obtained from a standard.

Probably the most widely used current method of measuring semiconductor lifetime during manufacture involves the use of either charge injection-extraction or the measurement of space-charge current generation, both of which are carried out in suitably fabricated device test structures on the wafers of interest. However, the steps involved in the test-structure fabrication itself can seriously affect the carrier lifetime, thereby greatly complicating the interpretation of the measurement. In addition to this there is of course the inconvenience of having to prepare the test structures. An alternative, currently used method of lifetime measurement is that of "Surface Photo Voltage" (SPV). This involves determination of the steady-state change in the semiconductor surface potential as a function of optical illumination.

A serious difficulty encountered in the SPV method, and indeed in all attempts to measure carrier lifetime in thin semiconductor samples, is due to the perturbing effects of surface recombination. Often such effects are very much larger than the true bulk effects which are of interest. It is possible to allow for this difficulty by making measurements using, in sequence, light sources emitting at different wavelengths. We intend "light" to mean, in addition to visible light, also the regions of the electromagnetic spectrum adjacent to the visible band, in particular, the near infrared. Short wavelength light will have a relatively short penetration depth into the sample, thus creating electron-hole pairs preferentially in the vicinity of the surface, which leads to enhanced surface effects. Conversely, longer wavelength light penetrates more deeply into the material, and thus a measurement that uses such light would be less subject to surface effects. Making lifetime measurements at more than one wavelength of light thus permits extrapolation to infinite wavelength, which coresponds to the true bulk lifetime. However, this method is complicated and timeconsuming, and, furthermore, requires the use of calibrated light sources.

A completely different alternative method of circumventing the surface recombination problem is available to the new conductivity-based lifetime method described here. This depends on creating a thin surface layer of the semiconductor material of the same type but much higher conductivity than the bulk material, i.e., one produces a thin layer having much higher impurity concentration than the bulk. Such a layer can readily be produced and has the effect of keeping the bulk minority carriers away from the surface, thereby eliminating surface recombination effects. Using this approach, in conjunction with the inventive technique, is particularly advantageous when monitoring semiconductor wafers during device manufacturing, since blank wafers having such a surface layer can be easily prepared, and this approach eliminates not only the need for measurements using different light sources but also the need for the data manipulation that is necessary when using the former method.

The disclosed noncontacting method for the measurement of minority carrier lifetime in semiconductor material can be understood by reference to FIG. 1. There is shown a typical sample, magnetically coupled by means of a ferrite core to an LC resonant tank circuit. This parallel resonant circuit is driven by an amplitude stabilized RF marginal-oscillator. The apparatus is adapted to measuring the electrical conductivity of the wafer, in a manner analogous to a method for the contactless measurement of electric conductivity of conductive lamellae described in U.S. Pat. No. 4,000,458. However, it is also possible to practice the instant invention with apparatus that does not use the features disclosed by that patent, as will be apparent to those skilled in the art. For instance, a marginal-oscillator that is not amplitude stabilized can be used for monitoring purposes.

FIG. 1 also shows a light source that is switched on and off at a rate much lower than the inverse of the longest relevant lifetime in the sample. It is convenient to use a light emitting diode (LED) for this purpose. When the LED is turned on the conductivity increases from its initial equilibrium value in accordance with equation 1.

$$\Delta\sigma(t) \propto \mu\tau(1-e^{-t/\tau}). \tag{1}$$

Here $\Delta\sigma$ is the change in conductivity brought about by the photoeffect, $\mu$ is the sum of the hole and electron mobilities, $\tau$ is the effective minority carrier lifetime and t is the time elapsed since turning on the LED. An analogous expression describes the decay of photoconductivity upon turning off the LED. Consequently, if the light source is turned on and off slowly, i.e., at a frequency low compared to $1/\tau$, then the observed conductivity is modulated by an amount $\Delta\sigma(\infty)$, which is proportional to the quantity $\mu\tau$. Since the mobility $\mu$ is only weakly dependent on semiconductor sample processing, variations in $\Delta\sigma$ are, to a good approximation, directly proportional to variations in the carrier lifetime. In practice, one calibrates the apparatus by measuring the photoconductivity $\Delta\sigma(\infty)$ in a sample of known minority carrier lifetime. Because this method of measuring conductivities is known to be linear, one such measurement is sufficient to determine the calibration curve for all values of lifetime $\tau$ in similar semiconductor samples.

EXEMPLARY MEASUREMENT APPARATUS

Figure 2:
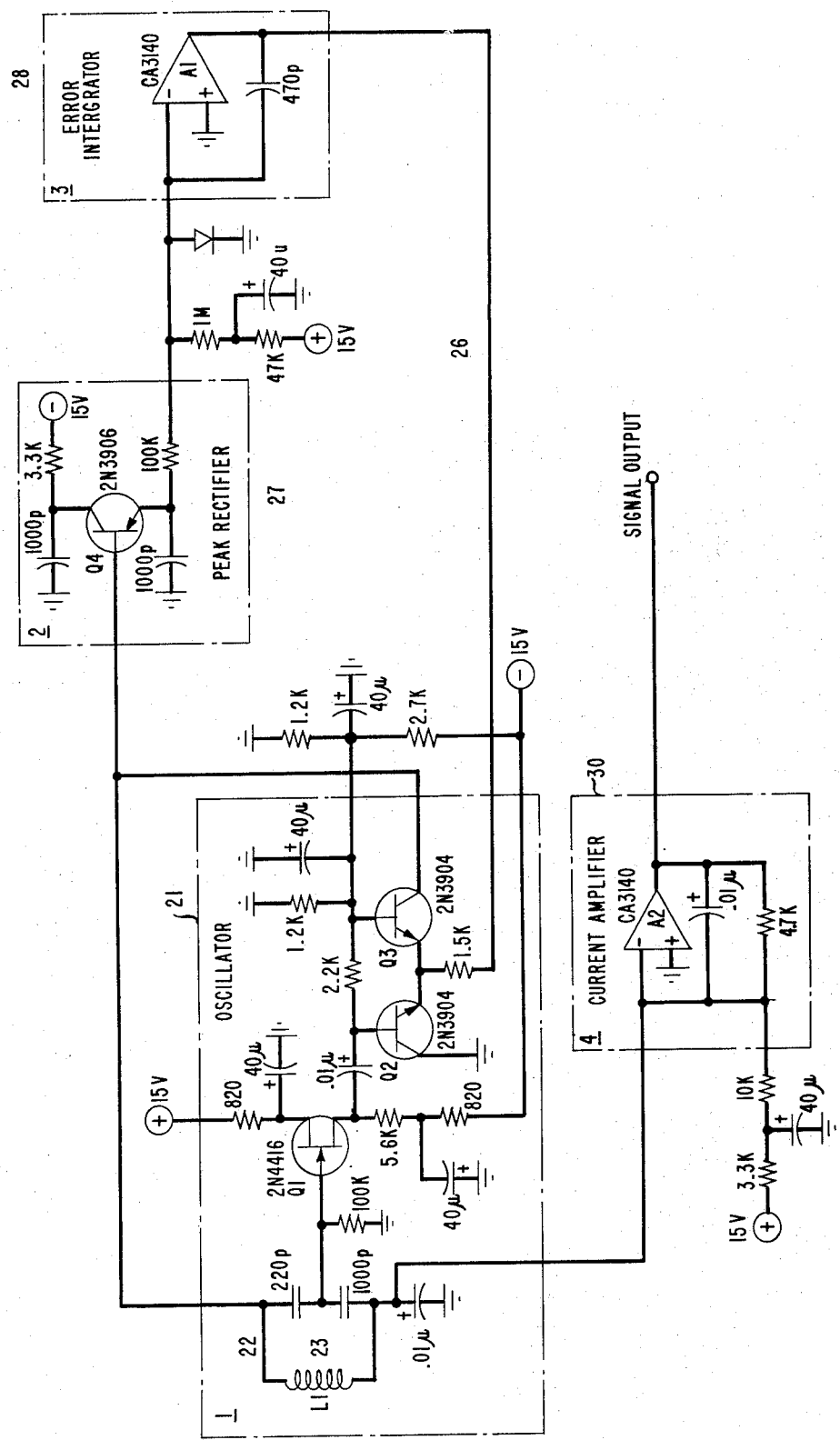
FIG. 2 is a circuit diagram of an exemplary network developed for the practice of the claimed method.

FIG. 2 shows a circuit diagram of an exemplary circuit developed and constructed for the practice of the inventive method. This circuit is closely analogous to a circuit disclosed in U.S. Pat. No. 4,000,458, which was part of apparatus for the measurement of electrical conductivity of lamellae. Difference between that circuit and the circuit disclosed herein are due primarily to the use of a substantially larger RF signal in the present embodiment, which results in proportionally increased sensitivity of the apparatus.

Box 1, outlined by dashed line 21, includes the resonant tank circuit 22 and the various transistors which form the RF oscillator. The elements are arranged to form an amplitude stabilized marginal-oscillator, whose frequency of oscillation is controlled by the tank circuit 22. A description of this type of oscillator can be found in *Journal of Schientific Instruments*, Vol. 36, page 481

(1959). For lifetime measurements the sample to be measured is magnetically coupled to the inductor 23. The amplitude of oscillation of the tank circuit 22 is automatically kept at a constant level by means of feedback supplied through conductor 26. The RF signal is applied to the base of transistor Q4, which is part of a peak rectifier, shown in Box 2, outlined by dashed line 27. The output of the rectifier is fed to the inverting input terminal of operational amplifier A1, which is arranged to form an error integrator circuit, and is shown in Box 3, outlined by dashed line 28. The output of the error integrator is then fed back to the oscillator, thereby maintaining a constant amplitude of RF oscillation. A feature of the oscillator is that the average DC current flowing to ground on the grounded side of the tank circuit 22 is an accurate measure of the magnitude of the oscillation frequency drive current, i.e., the current required to maintain the RF oscillation at constant amplitude. This current, the amplitude of which is a function of the conductivity of the semiconductor material adjacent to the inductor 23, is sensed and amplified by the current amplifier, as shown in Box 4, outlined by dashed line 30. In the instant measurement apparatus, the output of the current amplifier was fed to an amplifier and a phase sensitive detector, in this case, a Dynatrac No. 391 lock-in amplifier. The output of the lock-in amplifier was calibrated to indicate carrier lifetime directly in microseconds.

Figure 4:
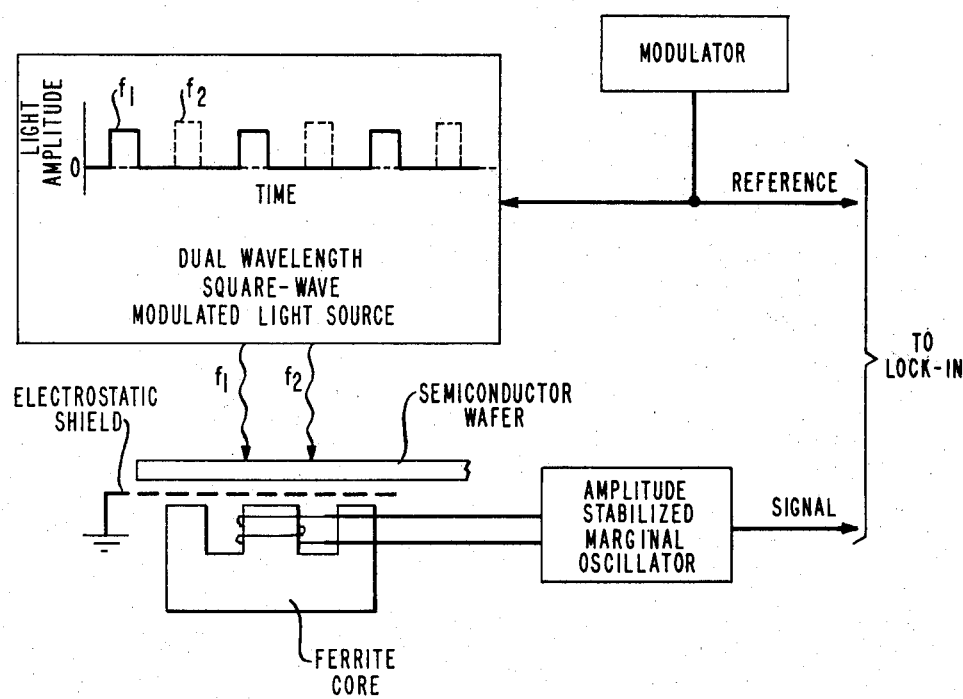
FIG. 4 is a schematic representation of the basic element of a device for the practice of the claimed method wherein plural light sources of different frequencies are used.

In the experimental apparatus, inductor 23 uses a high Q ferrite core with six turns, resulting in approximately two microhenries of inductance. Together with the component values indicated in FIG. 2, this resulted in an RF resonant frequency of approximately 10 megahertz. At this frequency the ferrite core material is characterized by a permeability of approximately 100. The overall Q of the tank circuit was approximately 50. Capacitive coupling to the sample is minimized by inclusion of an electrostatic shield over the face of the core, as is schematically indicated in FIG. 1. FIG. 1 also shows the light emitting diode arranged opposite the ferrite core. However, it will be obvious that this is not the only possible arrangement. For instance, light emitting diodes could be arranged circumferentially around the base of the ferrite cup, resulting in illumination of the sample in only that annular ring which is the area probed by this method. Such an approach would permit the use of a split cup core, of the same design as was illustrated in U.S. Pat. No. 4,000,458, and would result in a further increase in sensitivity of the apparatus. Furthermore, if so desired, it is also possible, as shown in FIG. 4, to use LEDs of more than one kind, or devices emitting light at more than one frequency, such as second-harmonic generators, alternately emitting light of different frequencies, resulting in measurement data that would permit the elimination of surface recombination effects by the extrapolation method outlined above. Furthermore, such an arrangement could be used to monitor the condition of the surface, by extrapolating the observed photoconductivity to zero instead of to infinite wavelength, as was discussed above. This might be useful in monitoring the effect of surface treatments.

Figure 3:
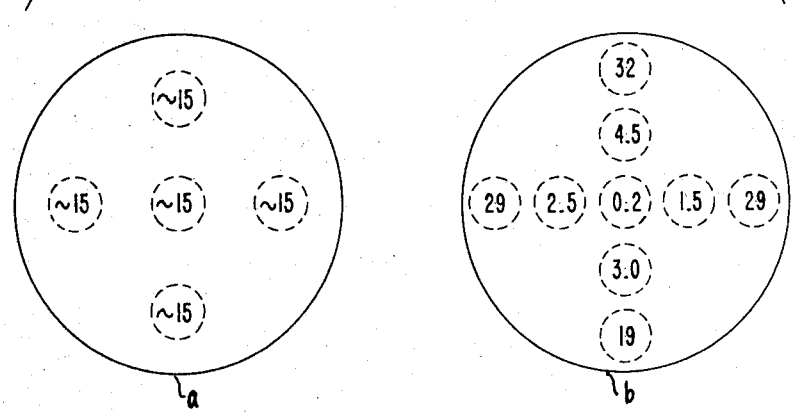
FIG. 3 is an illustration of the results of an actual measurement.

The experimental apparatus was used to make measurements on silicon wafers of the kind used for the production of semiconductor devices, and the results of measurements on a particular wafer are shown in FIG. 3. After a preliminary treatment, consisting of phosphorus ion implantation, followed by a 900 degrees C. nitrogen-ambient anneal, the carrier lifetime in the sample was measured, and found to be fairly uniform at ~15 microseconds, as is shown in FIG. 3(a). Next, this wafer was subjected to a heavy phosphorus backside gettering diffusion, designed to remove heavy metal impurities. Following the gettering process the lifetime was again measured, and the result is shown in FIG. 3(b). It can be seen that around the periphery of the wafer the lifetime increased, as expected, but in the central region of the wafer the lifetime decreased drastically by nearly two orders of magnitude. This obviously highly undesirable result was probably due to the presence of a large radial gradient of oxygen introduced into the silicon ingot from which the wafer had been cut, during the growth process of the ingot. It is obvious that it would be advantageous to be able to detect this and similar problems before incurring the expense of device manufacture, preferably by the use of a simple measurement technique. The instant invention provides such a technique.

Although the circuit described here is an amplitude stabilized marginal-oscillator that incorporates a parallel resonant circuit driven by a high impedance source, the practice of the instant invention is not dependent on the use of this circuit. For instance, it can be practiced with the aid of a non-stabilized marginaloscillator. Also, realizations equivalent to the one described here employing a series resonant tank circuit are possible, as well as analogous schemes employing capacitive coupling. And of course other light sources could be employed, as well as different ways of signal processing.

I claim:

1. A method for contactless steady-state monitoring of minority carrier lifetime in a sample of semiconductor material, comprising
    (a) electromagnetically coupling the sample into an inductance-capacitance resonant circuit adapted to resonate at a measurement frequency,
    (b) intermittently illuminating, at a switching frequency substantially lower than the inverse of the minority carrier lifetime, at least part of the sample adjacent to the coupling means with electromagnetic radiation adapted to cause photoconductivity in the sample, and
    (c) measuring the difference in measurement frequency voltage across the resonant circuit between the period of illuminating the sample and the period of nonilluminating the sample.

2. A method for contactless steady-state monitoring of minority carrier lifetime in a sample of semiconductor material, comprising
    (a) electromagnetically coupling the sample into an inductance-capacitance resonant circuit adapted to resonate at a measurement frequency,
    (b) maintaining the measurement frequency voltage across the circuit at a constant value, by suitably adjusting the measurement frequency drive current,
    (c) intermittently illuminating, at a switching frequency substantially lower than the inverse of the minority carrier lifetime, at least part of the sample adjacent to the coupling means with electromagnetic radiation adapted to cause photoconductivity in the sample, and
    (d) measuring the difference in measurement frequency current flowing into the circuit between the period of illuminating the sample and of nonilluminating the sample.

3. The method of claim 1 or 2, in which the means for the electromagnetic coupling comprise at least one inductor coil.

4. The method of claim 1 or 2, in which the means for the electromagnetic coupling comprise at least one capacitor.

5. The method of claim 1 or 2, in which the electromagnetic radiation is light emitted by at least one light emitting semiconductor device.

6. The method of claim 1 or 2 in which the measurement is carried out on a sample having one conductivity type, the sample having at least one thin surface layer of material of substantially higher conductivity as the bulk, of the same conductivity type as the bulk of the sample.

7. The method of claim 1 or 2, in which the measurement is carried out on a sample having at least one insulating surface layer covering at least the area of the sample adjacent to the coupling means.

8. The method of claim 1 or 2, in which the electromagnetic radiation is light of a first frequency, emitted by at least one light emitting device, and light of a second frequency, emitted by at least one light emitting device, the at least one light emitting device adapted to emitting light pulses in a sequence, the sequence consisting, in any order, of periods when only light of the first frequency is emitted, of periods when only light of the second frequency is emitted, and of periods when no light is emitted.

9. The method of claim 8 in which the light of the first frequency is emitted by at least one first device, and light of the second frequency is emitted by at least one second device.

* * * * *